United States Patent [19]
Allstot et al.

[11] Patent Number: 5,149,992
[45] Date of Patent: Sep. 22, 1992

[54] MOS FOLDED SOURCE-COUPLED LOGIC

[75] Inventors: David J. Allstot, Pittsburgh, Pa.; Sayfe Kiasei, Corvallis, Oreg.

[73] Assignee: The State of Oregon Acting by and Through the State Board of Higher Education on Behalf of Oregon State University, Eugene, Oreg.

[21] Appl. No.: 693,532

[22] Filed: Apr. 30, 1991

[51] Int. Cl.[5] .......................................... H03K 17/16
[52] U.S. Cl. .................................... 307/448; 307/443
[58] Field of Search ............... 307/450, 451, 448, 443, 307/362, 355, 359, 475, 542, 544; 364/600-602

[56] References Cited

U.S. PATENT DOCUMENTS

| | | | |
|---|---|---|---|
| 4,445,051 | 4/1984 | Elmasry | 307/450 |
| 4,661,725 | 4/1987 | Chantepie | 307/450 |
| 4,831,284 | 5/1989 | Anderson et al. | 307/450 |
| 4,939,390 | 7/1990 | Coe | 307/450 |

OTHER PUBLICATIONS

Horst H. Berger and Siegfried K. Wiedmann, *Merged-Transistor Logic (MTL)–A Low-Cost Bipolar Logic Concept*, IEEE Journal of Solid-State Circuits, vol. SC-7, No. 5, Oct. 1972, pp. 340-346.

Kees Hart and Arie Slob, *Integrated Injection Logic: A New Approach to LSI*, IEEE Journal of Solid-State Circuits, vol. SC-7, No. 5, Oct. 1972, pp. 346-351.

Primary Examiner—David Hudspeth
Attorney, Agent, or Firm—Klarquist, Sparkman, Campbell, Leigh & Whinston

[57] ABSTRACT

In integrated circuitry having both analog and digital circuits fabricated on the same substrate, switching transients produced by the digital circuitry can propagate through the substrate and induce deleterious effects in the associated analog circuitry. Such switching transients are greatly minimized by a CMOS source-coupled current-steering differential logic topology. In the preferred embodiment, gain and level shifting functions are merged, and connections to the power bus are made through constant current sources.

23 Claims, 3 Drawing Sheets

SHARED BIAS CIRCUIT | FSCL GATE (b)

MOS FOLDED SOURCE-COUPLED LOGIC

FIELD OF THE INVENTION

The present invention relates to integrated circuitry, and more particularly relates to a digital circuit topology that greatly minimizes switching current transients, thereby facilitating operation of digital and analog circuitry on common substrates.

BACKGROUND AND SUMMARY OF THE INVENTION

The continued proliferation of mixed analog/digital VLSI systems demands new design techniques for mixed-mode integrated circuits. While a conventional static CMOS logic gate has many desirable properties, its primary problem for high-speed, high-performance mixed-mode ICs is the generation of a very large current spike (typically several mA per gate per transition) during the transition between states. In a typical VLSI circuit, hundreds or thousands of logic gates may switch states simultaneously. The resulting current pulses can generate substantially large switching noise and voltage drops on the power supply lines due to the IR and LdI/dt effects. For mixed-mode VLSI systems where the analog and digital circuitry share a common substrate and possibly common power lines, the digital switching noise inevitably couples into the analog circuitry degrading its accuracy, especially at higher frequencies.

In general, there are two different sources of extrinsic noise in a CMOS VLSI chip. The first is an induced noise appearing at a particular node in the circuit which is coupled (usually capacitively) from adjacent nodes. The other source of noise is due to the resistive and inductive effects of current spikes which are generated during the transitions of logic gates, and which are coupled globally to other circuitry via the common substrate and via radiation.

As large digital systems change states, large numbers of gates make transitions which generate very large current spikes. (See, for example, J. A. Olmstead, "Noise Problems in Mixed A/D ICs," Proceedings of the IEEE Custom Integrated Circuits Conference, pp. 659-662, 1986.) Since one of the power supply lines is usually connected to the common substrate of the CMOS IC (i.e., $V_{cc}$ if p-well CMOS, and GND if n-well CMOS), this noise is propagated through the substrate to all of the circuitry on the chip. The noise pollution associated with this power bus noise can significantly degrade the accuracy of analog circuits which share the same substrate.

Several methods have been proposed for reducing the effects of power bus noise. These including filtering the power busses using on-chip active filters and active guardbanding to increase the isolation between separate analog and digital circuitry on the same IC. However, none of these approaches has proved fully satisfactory.

In accordance with the present invention, switching current transients in mixed mode circuitry are greatly minimized by use of source-coupled differential CMOS logic circuits that steer a fixed current from one side of a differential topology to another depending on the applied input voltage. The circuitry can also feature a logic swing of about 500-800 millivolts, which results in substantial reduction in propagation delay, reactive power dissipation, and further reduction in the switching current spike. In the preferred embodiment, gain and level shifting stages are merged, resulting in still smaller current transients, lower power consumption, and higher speed.

The foregoing and additional features and advantages of the invention will be more readily apparent from the following detailed description, which proceeds with reference to the accompanying drawings.

DETAILED DESCRIPTION

Figure 1:
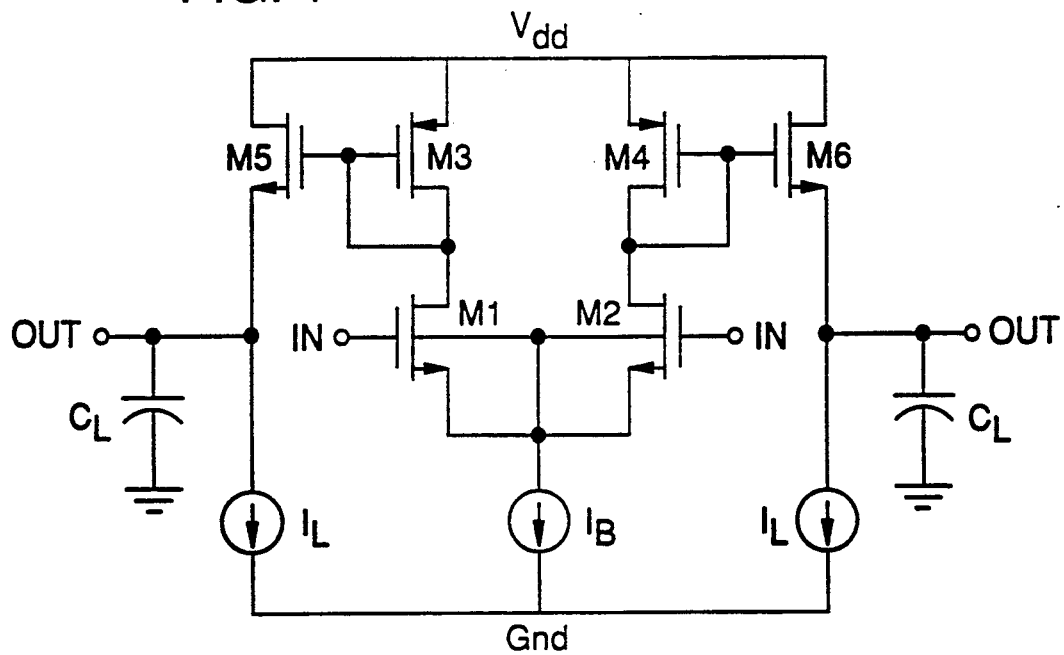
FIG. 1 is a schematic of a CMOS source-coupled logic inverter.

A fully-differential CMOS source-coupled logic (SCL) inverter is shown in FIG. 1. This circuit follows from the emitter-coupled-logic (ECL) technique which is commonly-used with bipolar technology, as illustrated by J. Lohstroh, "Devices and Circuits for Bipolar VLSI," Proceedings of the IEEE, Jul. 1981. The circuit consists of the direct-coupled cascade connection of two gain stages. The input stage is an NMOS differential amplifier while the output stages are simple NMOS source-follower circuits.

The basis of the SCL technique is an NMOS differential pair biased with a constant current source $I_L$. The switching mechanism is manifested as a steering of the bias current to only one side of the differential input pair based on the applied input voltage. The input differential stage is designed to operate with a differential input logic level, $\Delta V_L$, of about 800 mV. When $\Delta V_L$ is applied to $M_1$-$M_2$, $I_L$ is steered to one side of the differential pair while the other side is turned off. The PMOS diode-connected load devices, $M_3$-$M_4$, are sized to provide the desired logic level such that:

$$\Delta V_L = [2I_L/k_p'(W/L)_{3,4}]^{\frac{1}{2}} \tag{1}$$

By simply steering $I_B$ from one side to the other depending on the polarity of $\Delta V_L$, the current flowing into the input stage from $V_{dd}$ into GND is approximately constant. Hence, the large overlap current spikes associated with conventional CMOS static logic are largely eliminated. (In actuality, the current flowing from $V_{dd}$ into the input stage also contains displacement currents for charging and discharging the load capacitances of the first stage.)

Figure 6:
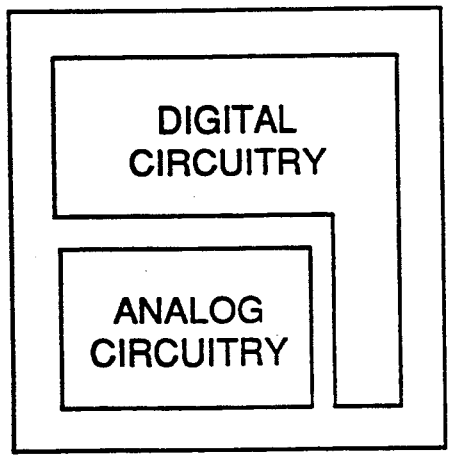
FIG. 6 is a schematic diagram illustrating analog and digital circuitry fabricated on a common substrate.

Turning to the NMOS output stages, the source-followers provide appropriate DC level-shifting to drive similar SCL stages. $M_5$-$M_6$ are sized, and $I_L$ is chosen to drive the load capacitance, $C_L$, at the desired speed. Considering the currents flowing in one of the level-shift stages, the current flowing from $V_{dd}$ into $M_5$ is the DC bias current, $I_L$, plus the displacement current, $C_L dV_{out}/dt$, required to charge or discharge $C_L$. In a p-well CMOS technology, the $V_{dd}$ power supply line is usually connected to the n-type substrate locally to deter latch-up. Hence, the voltage noise spikes resulting from these displacement current noise spikes are injected directly into the substrate, which is shared by the precision analog circuitry (FIG. 6), and may thus degrade the accuracy of the analog section. Note that if it were possible to use PMOS source-followers, the displacement currents would flow into GND, which is not required to be physically connected to the substrate. Therefore, by simply using separate power supply lines, displacement current noise spikes are prevented from degrading the accuracy of the analog section. Unfortunately, it is not possible to use PMOS source-followers with this particular circuit.

To eliminate the bandwidth shrinkage effect, the gain and level-shifting stages of SCL are merged into a single stage. Furthermore, only constant current sources are connected to $V_{dd}$ in a p-well CMOS technology so that minimal displacement current flows from $V_{dd}$. The result is the folded source-coupled logic (FSCL) of FIG. 2.

As noted, the gain and level-shifting functions are merged by employing a common-gate PMOS output structure. The logic level is:

$$\Delta V_L = [2I_L/k_p'(W/L)_{3,4}]^{\frac{1}{2}} - [2(I_L - I_B)/k_p'(W/L)_{3,4}]^{\frac{1}{2}} \quad (2)$$

Figure 3:
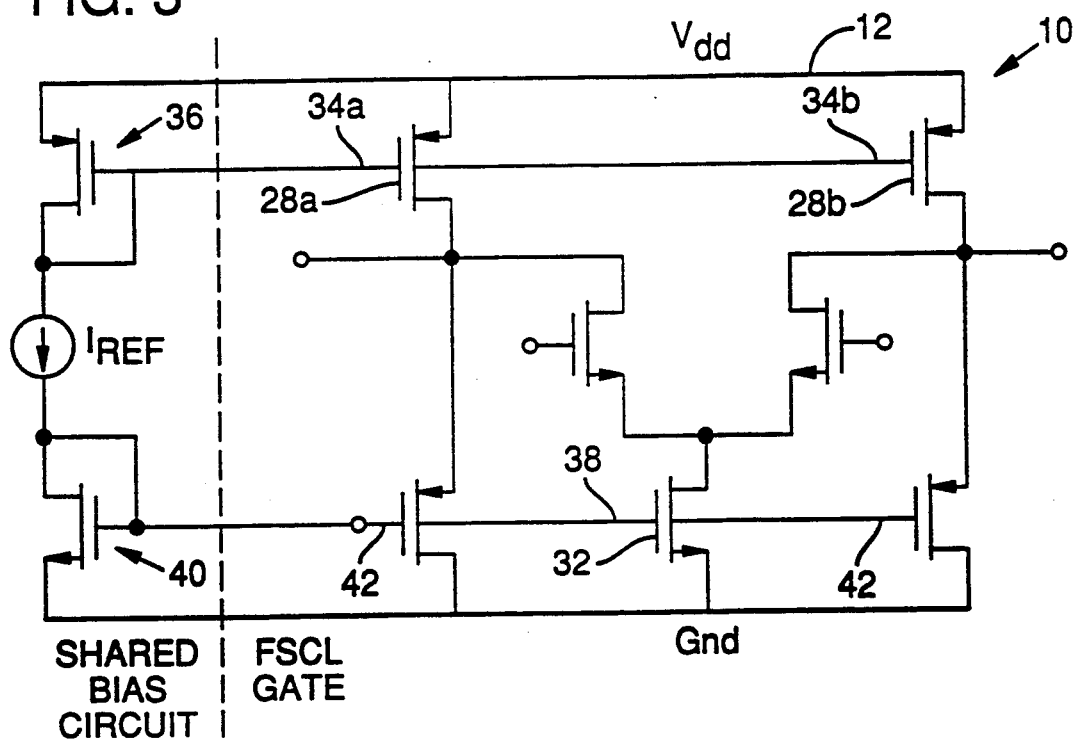
FIG. 3 is a more detailed schematic of the inverter of FIG. 2 showing certain of the bias circuitry.
Figure 4:
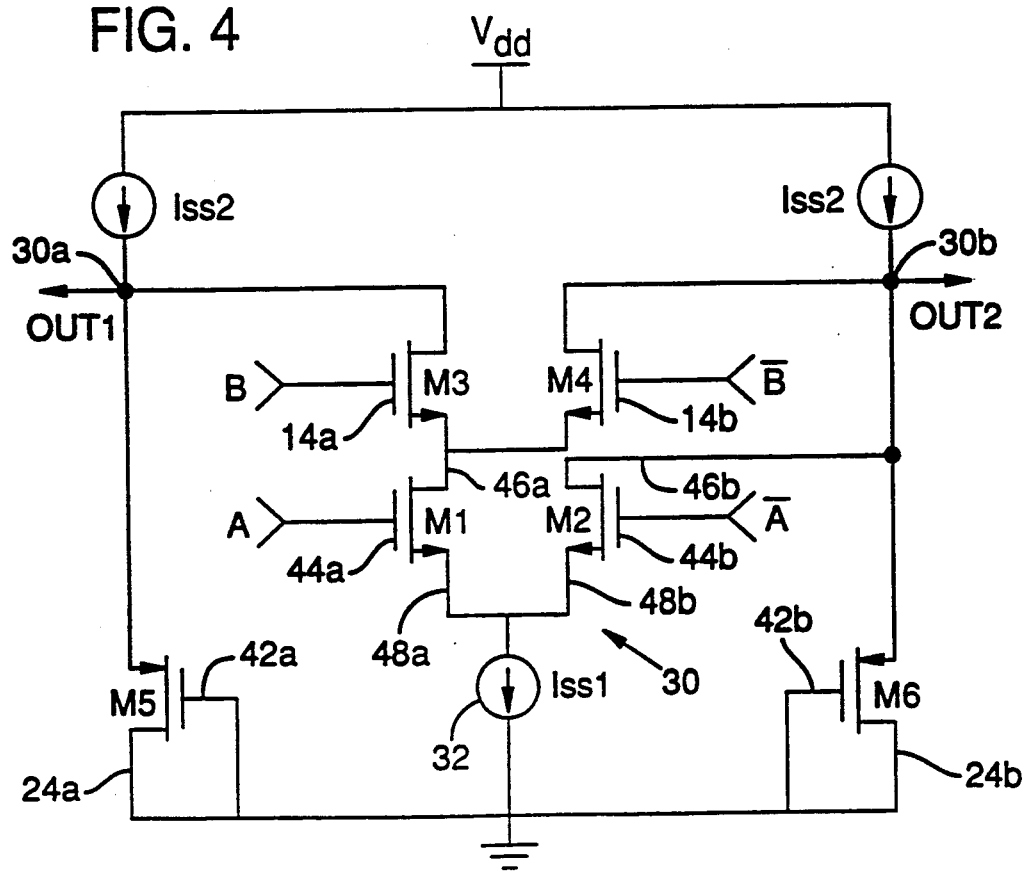
FIG. 4 is a schematic of a CMOS folded sourced-coupled AND/NAND gate.

Another advantage of FSCL is that only constant current sources, $I_L$, are connected to $V_{dd}$, and therefore displacement currents are prevented from generating noise spikes which may be coupled into the substrate. As shown in FIG. 3, the bias circuitry is simple and may be shared among a large number of gates on the chip. (More often, as shown in FIG. 4, the gates of transistors 16 are simply tied to ground.)

Figure 2:
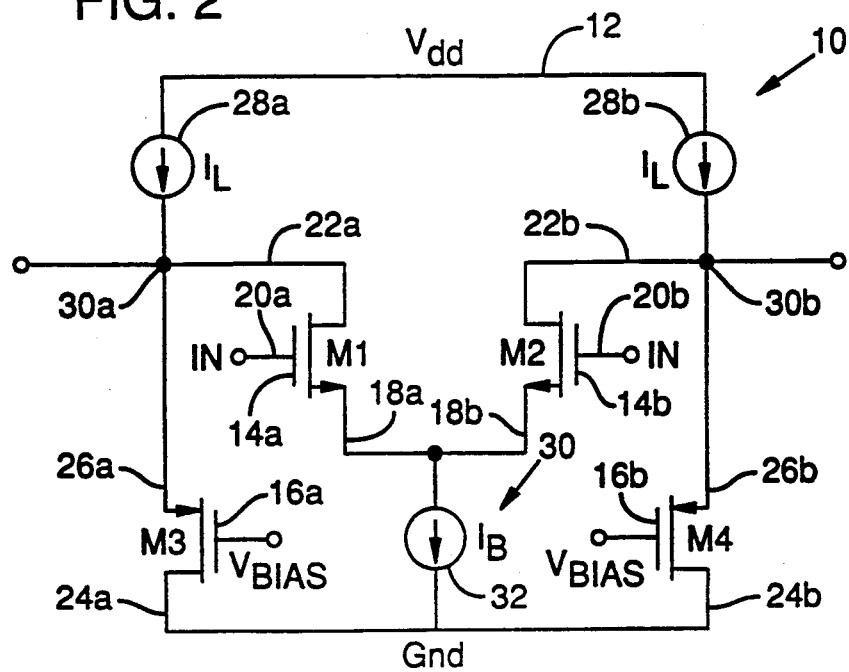
FIG. 2 is a schematic of a CMOS folded source-coupled logic inverter.

In greater detail, the inverter 10 of FIG. 2 includes a $V_{dd}$ power bus 12, first and second p-well NMOS input FETs 14a, 14b, and first and second n-substrate PMOS output FETs 16a, 16b. The input transistors 14 have their sources 18 connected together. Their gates 20 serve as circuit inputs, and their drains 22 serve as circuit outputs.

The output transistors 16 are connected in a common-gate arrangement, with their drains 24 grounded and their sources 26 connected to the drains 22 of the input transistors 14.

Power is provided to the circuitry from the power bus 12 through first and second constant current sources 28a, 28b, which couple to the nodes 30a, 30b defined by the drains 22 of the input transistors 14 and the sources 26 of the output transistors 16.

The connected sources 18 of the input transistors 14 are connected to the connected drains 24 of the output transistors 16 by a circuit path 30 that includes a third constant current source 32.

As shown more particularly in FIG. 3, the first and second current sources 28a, 28b are p-well NMOS transistors, and the third current source 32 is an n-substrate PMOS transistor. The gates 34 of the first and second current sources are tied together and driven from a common source 36 of bias voltage. The gate 38 of the third current source is driven from another source 40 of bias voltage, which in some embodiments is also applied to the common gates 42 of the output transistors 16. (In other embodiments, such as that shown in FIG. 4, the gates 42 of the output transistors are connected to their drains 24 and do not share bias voltage with gate 38. In still other embodiments, more complex PMOS current sources 28, such as cascode arrangements, may be used. Cascode current sources are particularly desirable since they would produce smaller noise spikes. Of course, myriad other current sources topologies can alternatively be used.)

It will be recognized that a variety of other circuits can be devised using this basic circuit topology. FIG. 4 shows, for example, a NAND/AND circuit which is substantially similar to that of FIG. 2 except for an additional differential pair of n-well CMOS FETs 44a, 44b that is interposed in the path 30 between the common sources of the input transistors and the common drains of the output transistors. In particular, the common sources of the input transistors 14 are connected to the drain 46a of transistor 44a. The drain 46b of transistor 44b is connected to circuit node 30b. The sources 48 of these transistors are connected together and to the drain of the transistor that serves as the third current source 32.

In this circuit, the gates of the input transistors 14 serve as B and NOT-B inputs. The gates of transistors 44 serve as A and NOT-A inputs. Node 30a serves as the NAND output and node 30b serves as the AND output.

In all the illustrated embodiments, the bulks of the p-well NMOS transistors are connected to a ground connection or to the common source point of the differential pair (the common drains of the output transistors 16 are used in the illustrated embodiment), and the bulks of the p-well CMOS transistors are connected to the $V_{dd}$ bus.

A 29-stage ring oscillator circuit of FSCL inverters according to the present invention was fabricated using 2 $\mu$m MOSIS p-well technology. The circuit shows an average propagation delay of about 680 pS, which is comparable to the speeds that can be achieved with conventional techniques using this technology. As stated before, a major objective of the invention was to develop a fast logic family that minimized the power supply noise generation for precision mixed-mode applications. The average current spike per gate per transition measured on the power bus was about 5–10 $\mu$A using the FSCL inverter. A conventional static CMOS inverter would exhibit a spike of several mA under the same conditions, and therefore the noise generation has been reduced by about two orders of magnitude.

Figure 5:
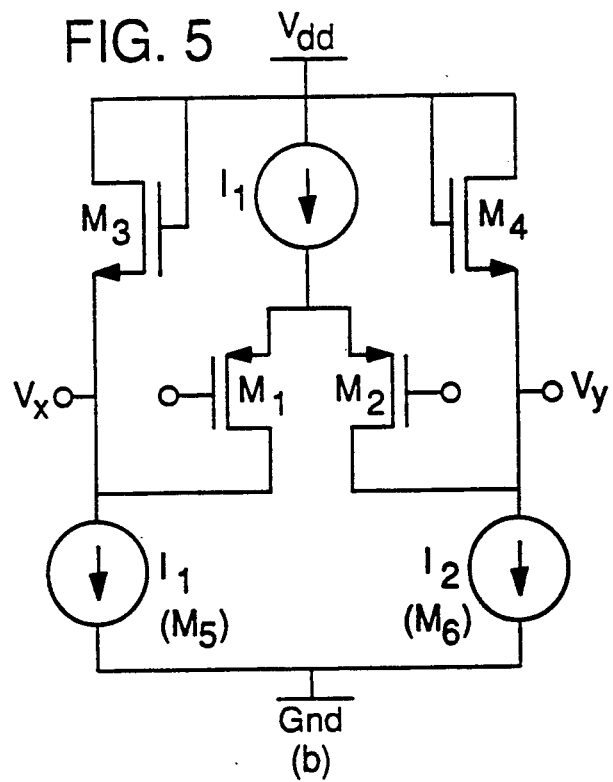
FIG. 5 is a schematic of an inverter like that of FIG. 2 but arranged for NMOS loads.

Having described and illustrated the principles of our invention with reference to a preferred embodiment, it will be apparent that the invention can be modified in arrangement and detail without departing from such principles. For example, while the invention has been illustrated with reference to CMOS transistors, it will be recognized that the invention may find applicability with other fabrication technologies, some of which are not yet presently known. Similarly, while the invention has been illustrated with reference to representative logic circuits, namely an inverter and an AND/NAND gate, it will be recognized that the invention may similarly be applied to a variety of other arithmetic and logic circuits. Still further, while the invention has been particularly illustrated with reference to an embodiment employing NMOS input transistors and PMOS output transistors, it should be apparent that transposition of device types can readily be achieved with only minor changes. Exemplary is the inverter of FIG. 5, which is arranged for NMOS loads.

Figure 7:
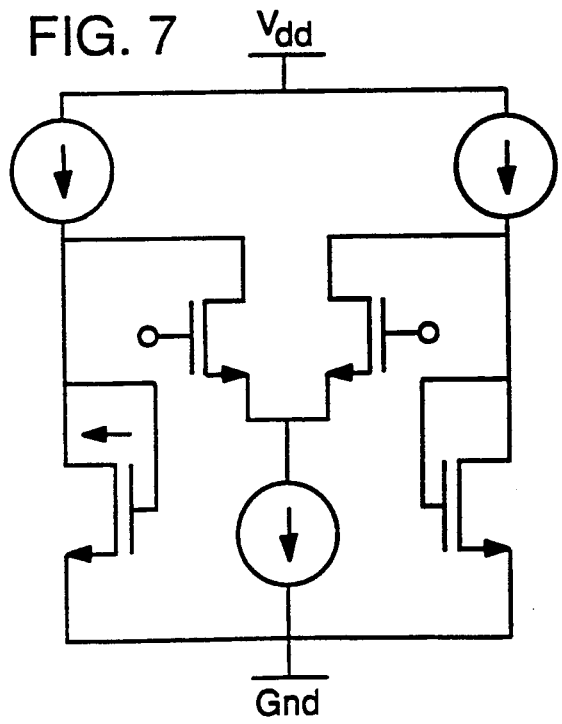
FIG. 7 is a schematic diagram of an output feedback variant of the FIG. 2 inverter.

Other variations, such as the output feedback variant of FIG. 7, will also be recognized to fall within the scope of the invention.

In view of the wide variety of embodiments to which the principles of my invention may be applied, it should be apparent that the detailed embodiment is illustrative only and should not be taken as limiting the scope of my invention. Rather, we claim as our invention all such modifications as may come within the scope and spirit of the following claims and equivalents thereto.

We claim:

1. An MOS logic circuit featuring reduced switching currents, the circuit comprising:
   a power bus having a substantially fixed voltage, which may be zero;
   first and second MOS input transistors connected in a source-coupled arrangement and each having an input and an output;
   first and second MOS output transistors connected in a common-gate arrangement and each having an input coupled to an output of an MOS input transistor;
   a first constant current source coupling the power bus to the first MOS input transistor and to the first MOS output transistor; and
   a second constant current source coupling the power bus to the second MOS input transistor and to the second MOS output transistor;
   wherein overlap currents and displacement currents are prevented from generating large noise spikes.

2. The circuit of claim 1 in which the first and second constant current sources are each cascode transistor circuits.

3. The circuit of claim 1 in which:
   the first and second constant current sources comprise first and second MOS current source transistors having their gates connected together
   the first current source couples current to the output of the first MOS input transistor and to the input of the first MOS output transistor; and
   the second current source couples current to the output of the second MOS input transistor and to the input of the second MOS output transistor.

4. The circuit of claim 1 in which the sources of the MOS input transistors are connected together, and the drains of the MOS output transistors are connected together, and said connected sources are coupled to said connected drains through a path that includes an MOS transistor constant current bias source.

5. The circuit of claim 4 in which the MOS transistor constant current bias source is a cascode transistor circuit.

6. The circuit of claim 4 in which a first bias voltage is applied to the common gates of the first and second MOS output transistors, and the same first bias voltage is applied to the gate of the MOS transistor constant current bias source.

7. The circuit of claim 4 in which the gates and drains of the first and second MOS output transistors are all interconnected.

8. The circuit of claim 4 in which the source coupled arrangement additionally includes at least one additional MOS transistor that cooperates with the first and second MOS input transistors to form an MOS logic block, to thereby realize a combinatorial logic function.

9. The circuit of claim 8 in which the source coupled arrangement further includes third and fourth MOS transistors, the drain of the third MOS transistor being coupled to the connected sources of the first and second MOS input transistors, the drain of the fourth MOS transistor being coupled to the output of the second MOS input transistor, and the coupled sources of the third and fourth MOS transistors being coupled to the connected drains of the first and second MOS output transistors through the MOS transistor constant current bias source.

10. The circuit of claim 1 in which:
    the first and second MOS input transistors are p-well NMOS transistors;
    the first and second MOS output transistors are n-substrate PMOS transistors; and
    the bulk terminals of the p-well transistors are connected to the power bus.

11. A mixed mode integrated circuit comprising:
    a substrate;
    one or more analog circuits fabricated on said substrate; and
    one or more digital circuits fabricated on said substrate;
    at least one of said digital circuits comprising:
    a power bus having a substantially fixed voltage, which may be zero;
    first and second input transistors connected in a source-coupled arrangement and each having an input and an output;
    first and second output transistors connected in a common-gate arrangement and each having an input coupled to an output of an input transistor;
    a first constant current source coupling the power bus to the first input transistor and to the first output transistor; and
    a second constant current source coupling the power bus to the second input transistor and to the second output transistor.

12. The circuit of claim 11 in which the first and second constant current sources are each cascode transistor circuits.

13. The circuit of claim 11 in which:
    the first and second constant current sources comprise first and second current source transistors having their gates connected together
    the first current source couples current to the output of the first input transistor and to the input of the first output transistor; and
    the second current source couples current to the output of the second input transistor and to the input of the second output transistor.

14. The circuit of claim 11 in which the sources of the input transistors are connected together, and the drains of the output transistors are connected together, and said connected sources are coupled to said connected drains through a path that includes a transistor constant current bias source.

15. The circuit of claim 14 in which the transistor constant current bias source is a cascode transistor circuit.

16. The circuit of claim 14 in which a first bias voltage is applied to the common gates of the first and second output transistors, and the same first bias voltage is applied to the gate of the transistor constant current bias source.

17. The circuit of claim 14 in which the gates and drains of the first and second output transistors are all interconnected.

18. The circuit of claim 14 in which the source coupled arrangement additionally includes at least one additional MOS transistor that cooperates with the first and second MOS input transistors to form an MOS logic block, to thereby realize a combinatorial logic function.

19. The circuit of claim 18 in which the source coupled arrangement further includes third and fourth MOS transistors, the drain of the third MOS transistor being coupled to the connected sources of the first and second input transistors, the drain of the fourth transistor being coupled to the output of the second input transistor, and the coupled sources of the third and fourth transistors being coupled to the connected drains of the first and second output transistors through the transistor constant current bias source.

20. The circuit of claim 11 in which:
the first and second MOS input transistors are p-well NMOS transistors;
the first and second MOS output transistors are n-substrate PMOS transistors; and
the bulk terminals of the p-well transistors are connected to the power bus.

21. The circuit of claim 11 in which:
the input transistors are p-well NMOS;
the output transistors are n-substrate PMOS;
the first and second constant current sources comprise at least first and second p-well CMOS current source transistors;
the sources of the current source transistors are connected to the power bus;
the gates of the current source transistors are connected together and to a bias voltage;
the drains of the first and second input transistors are connected to the drains of the first and second constant current source transistors, respectively;
the sources of the input transistors are connected together;
the sources of the first and second output transistors are connected to the drains of the first and second input transistors, respectively;
the drains of the output transistors are connected together;
the connected sources of the input transistors are coupled to the connected drains of the output transistors through a path that includes an p-well NMOS current source transistor.

22. An MOS logic circuit featuring reduced switching currents, the circuit comprising:
a power bus having a substantially fixed voltage, which may be zero;
first and second MOS transistors connected in a source-coupled arrangement and each having an input and an output;
third and fourth MOS transistors connected in a source-coupled arrangement, the drain of the third MOS transistor being connected to its gate and to the drain of the first MOS transistor, the drain of the fourth MOS transistor being connected to its gate and to the drain of the second MOS transistor, the sources of the first and second MOS transistors being coupled to the sources of the third and fourth MOS transistors by a path that includes a first constant current source;
a second constant current source coupling the power bus to the drain of the first MOS transistor;
a third constant current source coupling the power bus to the drain of the second MOS transistor;
wherein overlap currents and displacement currents are prevented from generating large noise spikes.

23. In a method of operating analog and digital circuitry on the same substrate, an improvement comprising operating at least a portion of the digital circuitry with a constant supply current by implementing said portion using differential circuitry and switching between constant current sources with each differential pair.

* * * * *